(12) United States Patent
Choi

(10) Patent No.: US 10,203,550 B2
(45) Date of Patent: Feb. 12, 2019

(54) DISPLAY DEVICE

(71) Applicant: Samsung Display Co., Ltd., Yongin, Gyeonggi-Do (KR)

(72) Inventor: Hosup Choi, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 474 days.

(21) Appl. No.: 14/991,680

(22) Filed: Jan. 8, 2016

(65) Prior Publication Data

US 2016/0238894 A1    Aug. 18, 2016

(30) Foreign Application Priority Data

Feb. 13, 2015 (KR) .................. 10-2015-0022626

(51) Int. Cl.
G02F 1/1335 (2006.01)
G02B 19/00 (2006.01)
H01L 33/58 (2010.01)
G02F 1/1333 (2006.01)

(52) U.S. Cl.
CPC ... *G02F 1/133605* (2013.01); *G02B 19/0014* (2013.01); *G02B 19/0066* (2013.01); *G02F 1/133603* (2013.01); *G02F 1/133606* (2013.01); *G02F 1/133608* (2013.01); *G02F 1/133504* (2013.01); *G02F 2001/13332* (2013.01); *G02F 2001/133314* (2013.01); *G02F 2001/133613* (2013.01); *H01L 33/58* (2013.01)

(58) Field of Classification Search
CPC ......... G02F 1/133605; G02F 1/133504; G02F 1/133603; G02F 1/133608; G02F 1/133606; G02B 19/0014; G02B 19/0066
See application file for complete search history.

(56) References Cited

U.S. PATENT DOCUMENTS

| | | |
|---|---|---|
| 6,332,690 B1 | 12/2001 | Murofushi |
| 8,979,294 B2 | 3/2015 | An et al. |
| 2007/0030694 A1 | 2/2007 | Lim |
| 2008/0285273 A1 | 11/2008 | Liu et al. |
| 2013/0070168 A1 | 3/2013 | Yokota |

(Continued)

FOREIGN PATENT DOCUMENTS

| | | |
|---|---|---|
| EP | 2811336 A2 | 12/2014 |
| JP | 2009-93000 A | 4/2009 |

(Continued)

OTHER PUBLICATIONS

European search report dated Jun. 30, 2016 from the European Patent Office in regard to the European Patent Application which corresponds to this US application.

*Primary Examiner* — Thomas M Sember
(74) *Attorney, Agent, or Firm* — H.C. Park & Associates, PLC

(57) ABSTRACT

A display device includes a display panel and a backlight unit providing the display panel with light. The backlight unit includes a first light source including a top emitting diode package and second and third light sources arranged in a first direction to allow the first light source to be disposed between the second and third light sources. Each of the second and third light sources includes a side emitting diode package. An optical distance between the top emitting diode package of the first light source and the optical member is greater than optical distances between the optical member and the side emitting diode packages of the second and third light sources.

24 Claims, 17 Drawing Sheets

(56) References Cited

U.S. PATENT DOCUMENTS

2014/0092356 A1    4/2014   Ahn et al.
2014/0111736 A1    4/2014   An et al.
2015/0253623 A1    9/2015   Lee et al.

FOREIGN PATENT DOCUMENTS

| | | |
|---|---|---|
| JP | 2010-2486 A | 1/2010 |
| JP | 5187270 B2 | 2/2013 |
| KR | 10-2011-0025493 A | 3/2011 |
| KR | 10-2014-0036461 A | 3/2014 |
| KR | 10-2014-0052446 A | 5/2014 |
| KR | 10-2014-0075987 A | 6/2014 |

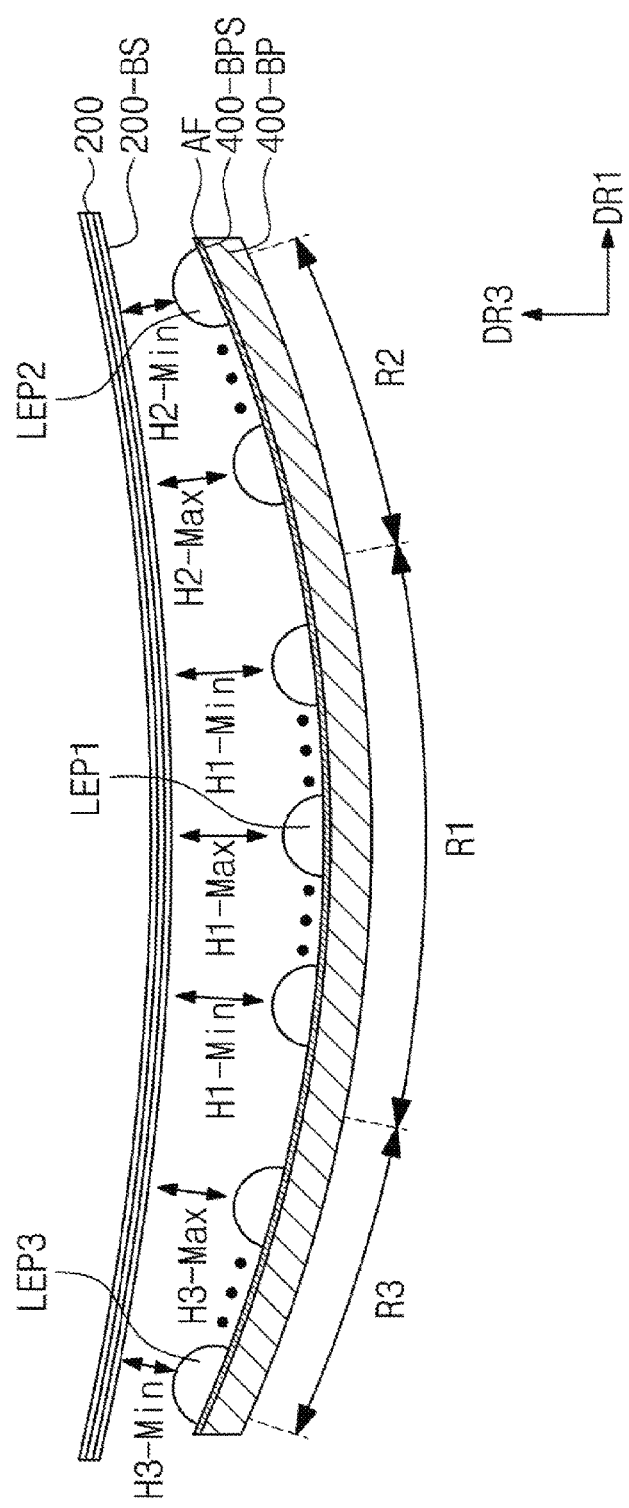

DISPLAY DEVICE

CLAIM OF PRIORITY

This U.S. non-provisional patent application claims the priority of and all the benefits accruing under 35 U.S.C. § 119 of Korean Patent Application No. 10-2015-0022626, filed on Feb. 13, 2015, the contents of which are hereby incorporated by reference in its entirety.

BACKGROUND OF THE INVENTION

1. Field of Disclosure

The present disclosure relates to a display device. More particularly, the present disclosure relates to a curved display device.

2. Description of the Related Art

A flat panel display device is applied to a variety of information processing devices, such as a television set, a monitor, a notebook computer, a mobile phone, etc., to display an image. In recent years, a curved display device with a curved display surface has been developed. The curved display device provides a user with the image having improved three-dimensional effect, sense of immersion (or immersiveness), and presence of the image.

The curved display device includes a curved display panel, a backlight unit, an optical member, and a cover member. The backlight unit is classified into an edge-illumination type backlight unit and a direct-illumination type backlight unit according to a position of a light source with respect to a display surface on which the image is displayed.

SUMMARY OF THE INVENTION

The present disclosure provides a curved display device having improved display quality. A flat panel display device is applied to a variety of information processing devices, such as a television set, a monitor, a notebook computer, a mobile phone, etc., to display an image. In recent years, a curved display device with a curved display surface has been developed. The curved display device provides a user with the image having improved three-dimensional effect, sense of immersion (or immersiveness), and presence of the image.

The curved display device includes a curved display panel, a backlight unit, an optical member, and a cover member. The backlight unit is classified into an edge-illumination type backlight unit and a direct-illumination type backlight unit according to a position of a light source with respect to a display surface on which the image is displayed.

Embodiments of the inventive concept provide a display device including a display panel including a display surface defined by a first direction and a second direction substantially perpendicular to the first direction and curved along the first direction and a backlight unit providing the display panel with light.

The backlight unit includes a first light source including a top emitting diode package, second and third light sources arranged in the first direction to allow the first light source to be disposed between the second and third light sources, a curved optical member disposed between the display panel and the first, second, and third light sources and curved along the first direction. Each of the second and third light sources includes a side emitting diode package. An optical distance between the top emitting diode package of the first light source and the optical member is greater than optical distances between the optical member and the side emitting diode packages of the second and third light sources.

The optical distance between the top emitting diode package of the first light source and the optical member is greater than a reference distance and the optical distances between the optical member and the side emitting diode packages of the second and third light sources are smaller than the reference distance.

A full-width at half-maximum of the top emitting diode package is substantially the same as a full-width at half-maximum of the side emitting diode package at the reference distance.

The reference distance is in a range from about 15 mm to about 20 mm. The optical member includes a diffusion sheet.

The first light source includes a plurality of first light source blocks arranged in the first direction, each of the first light source blocks includes a plurality of first light emitting diode packages arranged in the second direction and a first circuit board applying an electrical signal to the first light emitting diode packages. Each of the first light emitting diode packages is the top emitting diode package.

Each of the second and third light sources includes a plurality of second light source blocks arranged in the first direction, each of the second light source blocks includes a plurality of second light emitting diode packages arranged in the second direction and a second circuit board applying an electrical signal to the second light emitting diode packages, and each of the second light emitting diode packages is the side emitting diode package.

Each of the first light emitting diode packages includes a first light emitting element and a first lens disposed on the first light emitting element and having a semi-spherical convex lens surface. Each of the second light emitting diode packages includes a second light emitting element and a second lens including a first lens surface guiding light emitted from the second light emitting element to a first side of the first direction and a second lens surface guiding the light emitted from the second light emitting element to a second side of the first direction.

Each of the first, second, and third light sources is provided in a plural number along the second direction.

A distance in the first direction between two first light source blocks among the first light source blocks is smaller than a distance in the first direction between two second light source blocks among the second light source blocks.

Each of the first light source blocks includes a greater number of the light emitting diode packages than each of the second light source blocks.

The display device further includes a bottom cover accommodating the display panel and the backlight unit and curved along the first direction and a top cover covering the display panel and curved along the first direction.

The bottom cover includes a top surface including a first outer region, a center region, and a second outer region, which are sequentially arranged in the first direction to allow the center region to be disposed between the first and second outer regions, the first light source is disposed in the center region, and the second and third light sources are respectively disposed in the first and second outer regions.

The top surface of the bottom cover is curved at a curvature smaller than the top cover.

The top cover is curved at a first curvature, the center region is curved at a second curvature smaller than the first curvature, and each of the first and second outer regions is curved at a third curvature smaller than the second curvature.

The display device further includes a bottom cover accommodating the display panel and the backlight unit and a top cover covering the display panel and curved along the first direction.

The bottom cover includes a top surface including a first outer region, a center region, and a second outer region, which are sequentially arranged in the first direction to allow the center region to be disposed between the first and second outer regions, the center region is recessed from the first and second outer regions, the first light source is disposed in the center region, and the second and third light sources are respectively disposed in the first and second outer regions.

The display device further includes a bottom cover accommodating the display panel and the backlight unit, curved along the first direction, and including a first outer region, a center region, and a second outer region, which are sequentially arranged in the first direction to allow the center region to be disposed between the first and second outer regions, a first optical distance control member disposed in the first outer region, a second optical distance control member disposed in the second outer region, and a top cover covering the display panel and curved along the first direction.

The top surface of the bottom cover and the optical member are having a substantially same curvature, the first optical distance control member provides a first support surface on which the second light source is disposed, the second optical distance control member provides a second support surface on which the third light source is disposed, the first optical distance control member has a thickness increasing as a distance from the center region increases in the first direction, and the second optical distance control member has a thickness increasing as a distance from the center region increases in the first direction.

Embodiments of the inventive concept provide a display device including a display panel curved along a predetermined direction and a backlight unit providing the display panel with light. The backlight unit includes a first light source, a second light source, a third light source, and an optical member. The first light source includes a first light emitting diode package. Each of the second and third light sources includes a second light emitting diode package having a maximum light intensity at a luminous view angle greater than the first light emitting diode package. The second and third light sources are arranged in the predetermined direction to allow the first light source to be disposed between the second and third light sources. The optical member is disposed between the display panel and the first, second, and third light sources.

An optical distance between the first light emitting diode package of the first light and the optical member is greater than optical distances between the optical member and the light emitting diode packages of the second and third light sources.

The first light emitting diode package has the maximum light intensity at the luminous view angle in a range of about −30 degrees to about +30 degrees. The second light emitting diode package has the maximum light intensity at the luminous view angle in a range of about −90 degrees to about −60 degrees or in a range of about 60 degrees to about 90 degrees.

The backlight unit includes a center region in which the first light source is disposed, a first outer region in which the second light source is disposed, and a second outer region in which the third light source is disposed. The first outer region, the center region, and the second outer region are sequentially arranged in the predetermined direction to allow the center region to be disposed between the first and second outer regions, and the second light emitting diode package has a full-width at half-maximum greater than a full-width at half-maximum in the first and second outer regions.

According to the above, the backlight unit uniformly provides the light to the display panel without causing the bright spot (or optical stain).

The light emitting diode package is formed to have different densities in accordance with the regions, and thus a manufacturing cost of the backlight unit is reduced.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 4B is a cross-sectional view showing portions of the light sources disposed on the top surface of the bottom cover and an optical member;

DETAILED DESCRIPTION OF THE INVENTION

Hereinafter, the present invention will be explained in detail with reference to the accompanying drawings.

A flat panel display device is applied to a variety of information processing devices, such as a television set, a monitor, a notebook computer, a mobile phone, etc., to display an image. In recent years, a curved display device with a curved display surface has been developed. The curved display device provides a user with the image having improved three-dimensional effect, sense of immersion (or immersiveness), and presence of the image.

The curved display device includes a curved display panel, a backlight unit, an optical member, and a cover member. The backlight unit is classified into an edge-illumination type backlight unit and a direct-illumination type backlight unit according to a position of a light source with respect to a display surface on which the image is displayed.

Figure 1:
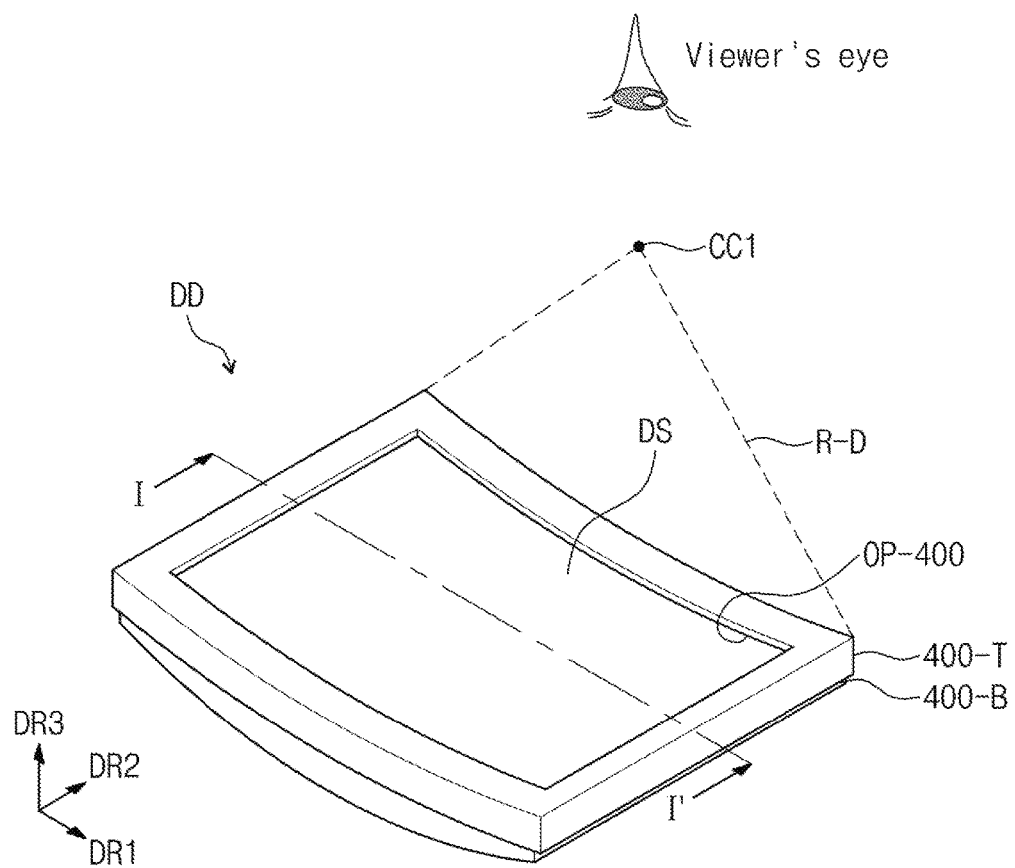
FIG. 1 is a perspective view showing a display device according to an exemplary embodiment of the present disclosure.
Figure 2:
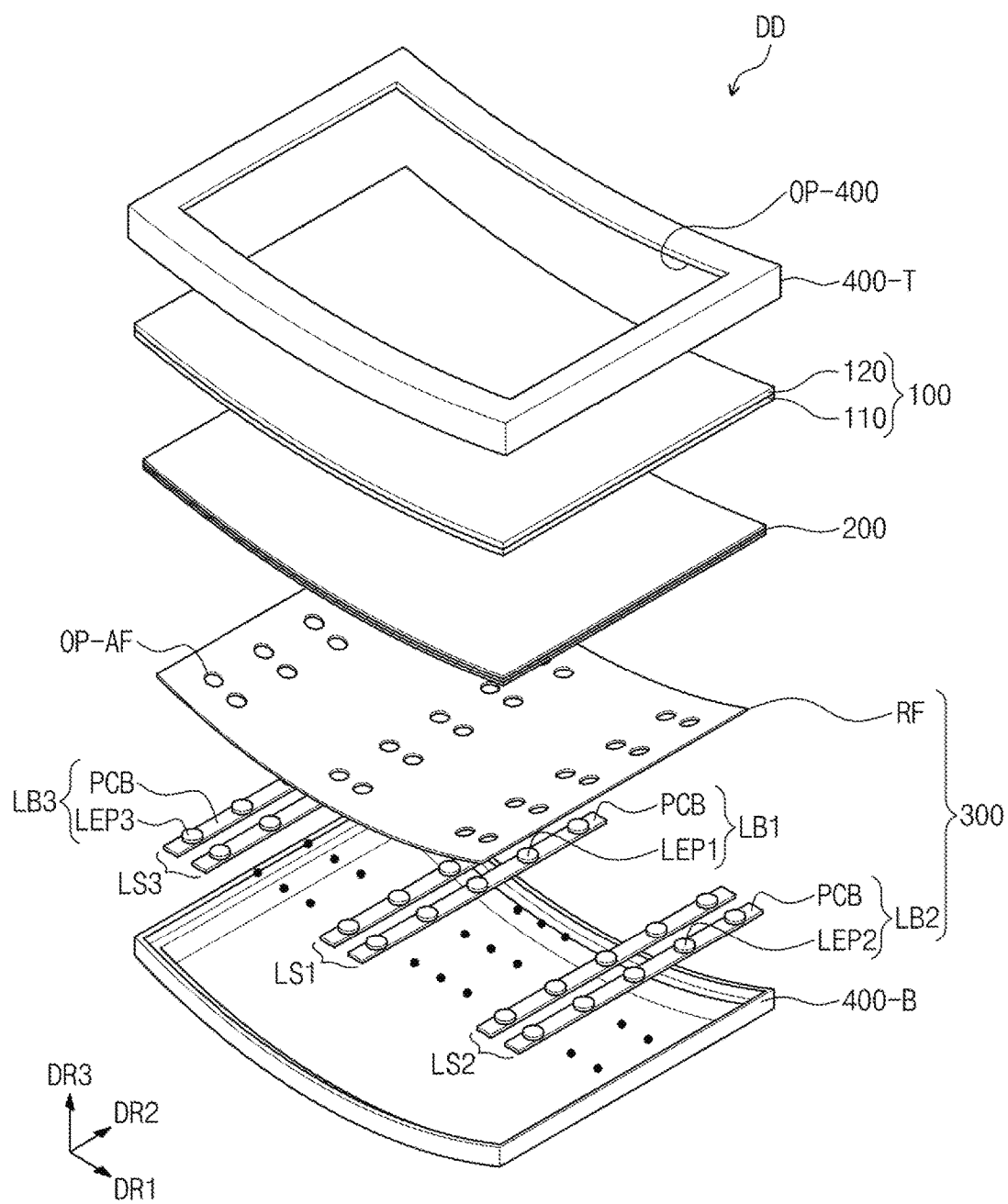
FIG. 2 is an exploded perspective view showing a display device according to an exemplary embodiment of the present disclosure.
Figure 3:
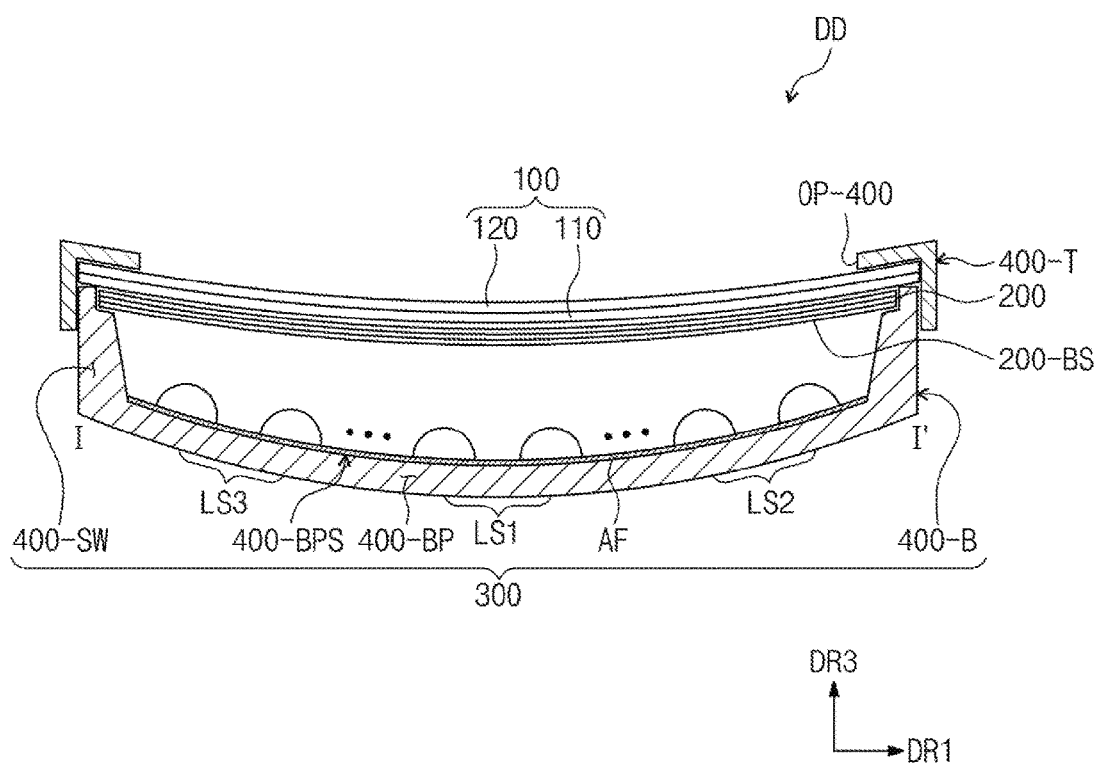
FIG. 3 is a cross-sectional view taken along a section line I-I' shown in FIG. 1.

FIG. 1 is a perspective view showing a display device DD according to an exemplary embodiment of the present disclosure, FIG. 2 is an exploded perspective view showing the display device DD according to an exemplary embodiment of the present disclosure, and FIG. 3 is a cross-sectional view taken along a section line I-I' shown in FIG. 1. Hereinafter, the display device DD will be described in detail with reference to FIGS. 1 to 3.

Referring to FIGS. 1 to 3, the display device DD includes a display panel 100, an optical member 200, a backlight unit 300, and cover members 400-B and 400-T. Although not in figures, the display device DD may further include a mold member to support the display panel 100 or the optical member 200.

As shown in FIG. 1, the display device DD has a predetermined curvature and a predetermined radius of curvature R-D (hereinafter, referred to as a first radius of curvature) with respect to a first point CC1 as a center of curvature. The display device DD includes a curved display surface DS. The display surface DS is provided from the display panel 100. The first radius of curvature R-D is measured from the display surface DS. For instance, when the display surface DS has a size of about 65 inches, the first radius of curvature R-D becomes about 4000 nm. The curvature and the first radius of curvature R-D of the display device DD are substantially the same as those of the display panel 100.

The display surface DS, which is in a flat state before being bent, is defined by a first direction DR1 and a second direction DR2 and a thickness direction of the display panel 100 is defined by a third direction DR3. In FIG. 1, the first direction DR1 indicates a horizontal direction and the second direction DR2 indicates a vertical direction.

Referring to FIGS. 1 to 3, the display panel 100 displays an image. The display panel 100 includes a non-self-emissive display panel such as a reflective and/or transmissive display panel or a transmissive display panel. Hereinafter, a liquid crystal display panel will be described as the display panel 100.

The display panel 100 includes a first substrate 110, a second substrate 120 facing the first substrate 110, and a liquid crystal layer (not shown) interposed between the first and second substrates 110 and 120. The liquid crystal layer includes liquid crystal molecules aligned in accordance with an electric field formed between the first and second substrates 110 and 120. Although not shown in figures, polarizing plates (not shown) may be respectively disposed on and under the display panel 100.

The display panel 100 is concave and curved along the first direction DR1. The first and second substrates 110 and 120 of the display panel 100 are formed of a flexible material. The display panel 100 is fixed to and/or coupled to the cover members 400-B and 400-T after being bent at a predetermined curvature. The cover members 400-B and 400-T absorb a repulsive force of the display panel 100 that tends to return to its original shape, i.e., the flat state. In other words, the curvature of the display device DD is maintained by the cover members 400-B and 400-T, but it should not be limited thereto or thereby. That is, the display panel 100 may include the first and second substrates 110 and 120 formed of a rigid material and having predetermined curvatures, and in this case, the display panel 100 may be maintained in the curved state by itself without being helped by other members like the cover members 400-B and 400-T.

The optical member 200 is disposed between the display panel 100 and the backlight unit 300 in the third direction DR3. The optical member 200 improves optical properties of light provided from the backlight unit 300 and provides the display panel 100 with the light. The optical member 200 includes at least a diffusion member. The diffusion member uniformly diffuses the light incident thereto. The optical member 200 may further include a prism sheet that condenses the light provided from the diffusion member and a protective sheet that protects the diffusion member and/or the prism sheet.

The optical member 200 has a predetermined curvature and a predetermined radius of curvature. The curvature and the radius of curvature of the optical member 200 may substantially the same as those of the display panel 100. The optical member 200 is disposed between the display panel 100 and the backlight unit 300 to allow the optical member 200 to be in a flat state.

The optical member 200 has a predetermined curvature and a predetermined radius of curvature. The curvature and the radius of curvature of the optical member 200 may be substantially the same as those of the display panel 100. The optical member 200 is disposed between the display panel 100 and the backlight unit 300 to allow the optical member 200 to be in a flat state The backlight unit 300 includes a reflective sheet RF and a plurality of light sources LS1, LS2, and LS3. The reflective sheet RF may be omitted depending on a material of a bottom cover 400-B or a material of a coating layer formed on the bottom cover 400-B, which are described later.

The first, second, and third light sources LS1, LS2, and LS3 include first, second, and third light source blocks LB1, LB2, and LB3, respectively. Each of the first, second, and third light source blocks LB1, LB2, and LB3 includes a circuit board PCB and a plurality of light emitting diode packages LEP1, LEP2, and LEP3. The reflective sheet RF includes a plurality of openings OP-RF formed therethrough to expose the light emitting diode packages LEP1, LEP2, and LEP3.

Hereinafter, the first light source LS1 will be described in detail as a representative example. The first light source LS1 includes a plurality of first light source blocks LB1. The first light source blocks LB1 are arranged in the first direction DR1 to be spaced apart from each other. The first light source blocks LB1 include the circuit board PCB extending in the second direction DR2 and the light emitting diode packages LEP1 disposed on the circuit board PCB. FIG. 2 shows the light source block including five light emitting diode packages LEP1 as a representative example.

The cover members 400-B and 400-T include the bottom cover 400-B and a top cover 400-T. The bottom cover 400-B and the top cover 400-T, which are coupled to each other, maintain the curved shape of the display device DD. Each of the bottom cover 400-B and the top cover 400-T is a chassis or plastic mold, which is integrally formed by an injection or extrusion molding process as a single unitary and individual unit, or includes plural parts coupled to each other.

The cover members 400-B and 400-T protect the display panel 100, the optical member 200, and the backlight unit 300. The bottom cover 400-B is provided with an opening OP-400 formed therethrough to expose a front surface of the display panel 100, and thus the display surface DS is defined. The first, second, and third light sources LS1, LS2, and LS3 are disposed on a top surface 400-BPS of the bottom cover 400-B. The reflective sheet RF covers the circuit boards PCB of the first, second, and third light sources LS1, LS2, and LS3 and is disposed on the top surface 400-BPS.

The bottom cover 400-B includes a bottom portion 400-BP and a sidewall 400-SW disposed along an edge of the bottom portion 400-BP. The side of bottom portion 400-BP facing viewer is concave and curved. A step difference is formed on an upper portion of the sidewall 400-SW. Due to the step difference of the sidewall 400-SW, edges of the optical member 200 are supported.

Figure 4A:
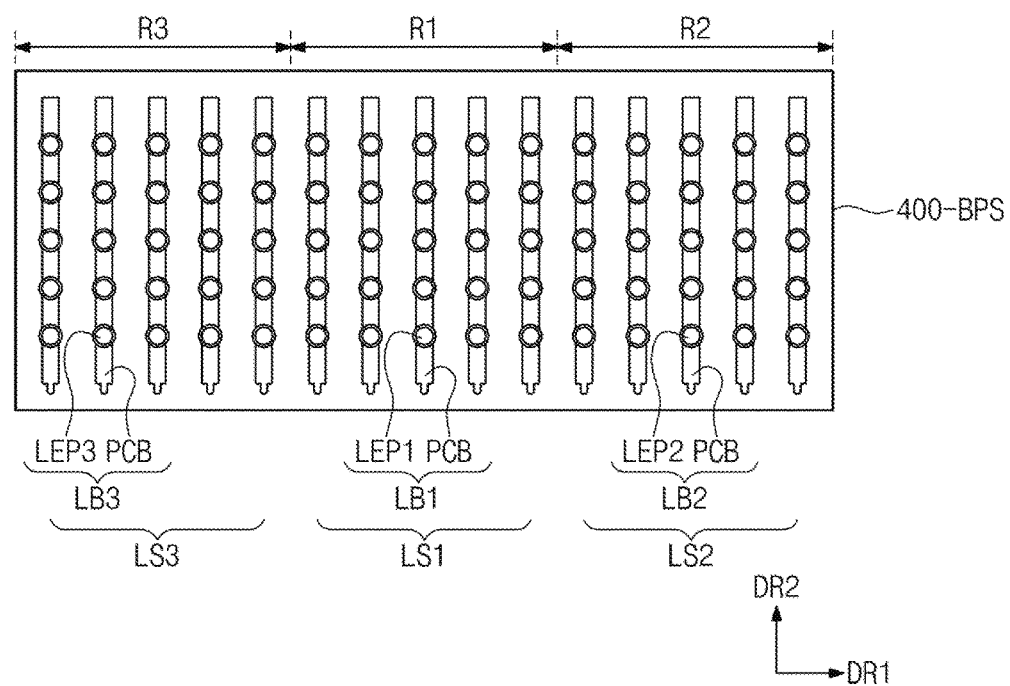
FIG. 4A is a plan view showing light sources disposed on a top surface of a bottom cover.
Figure 4C:
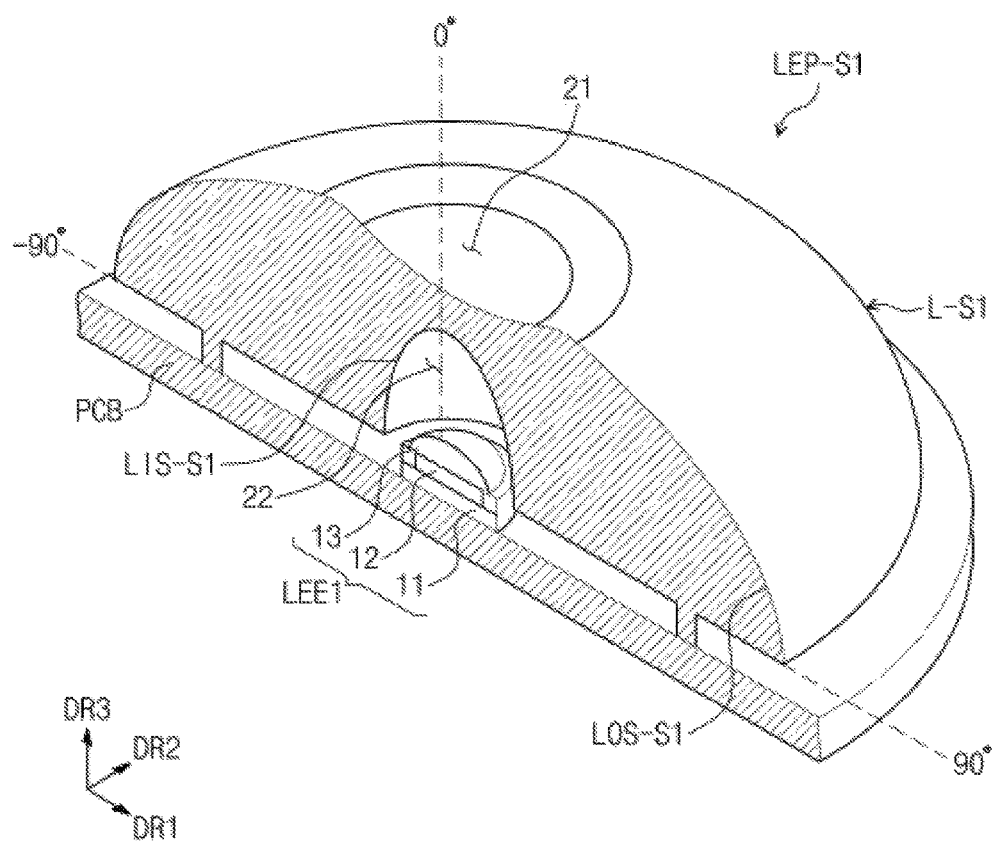
FIGS. 4C and 4D are cross-sectional views showing light emitting diode packages according to exemplary embodiments of the present disclosure.
Figure 4D:
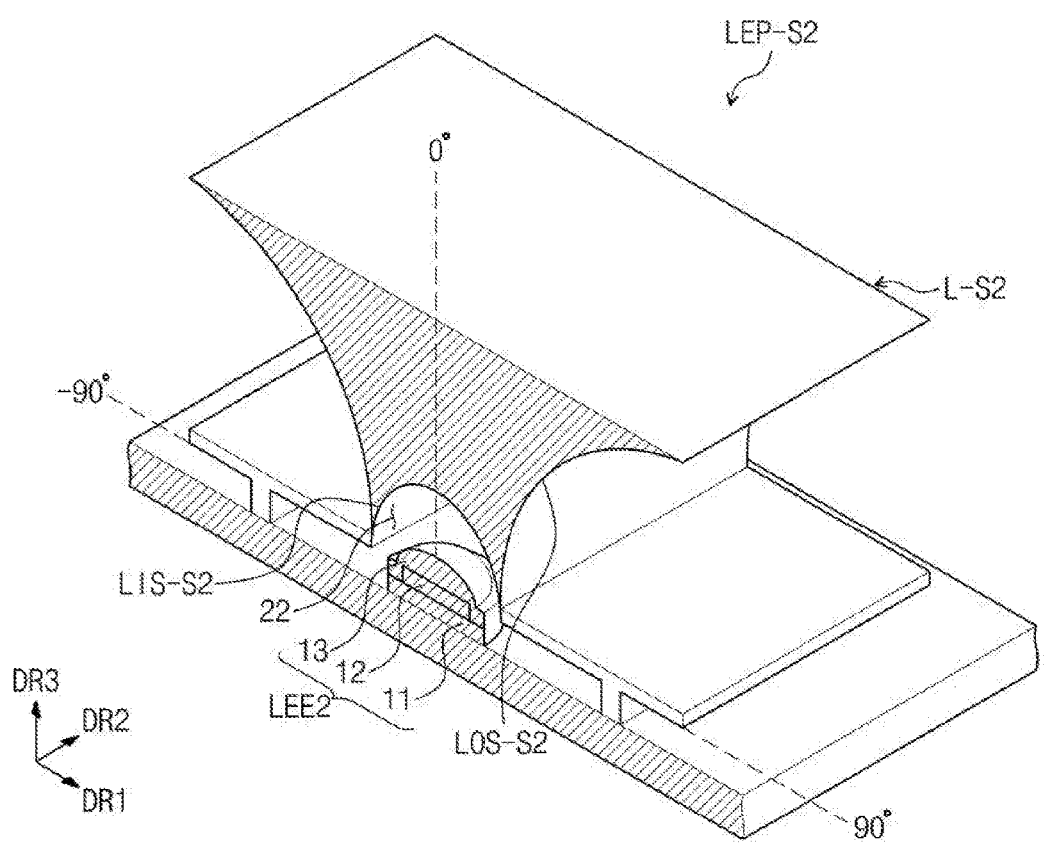
Figure 4E:
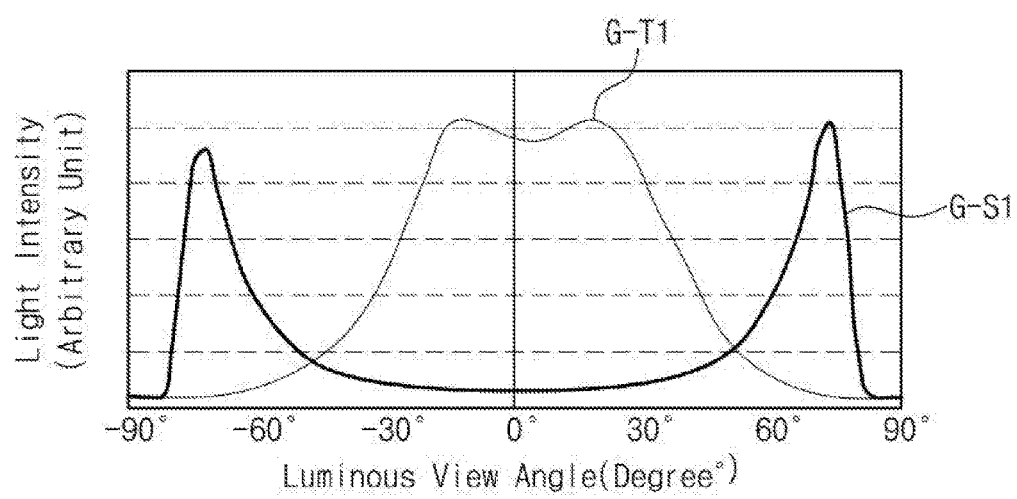
FIG. 4E is a graph showing a light intensity as a function of a luminous view angle of light emitting diode packages according to exemplary embodiments of the present disclosure.
Figure 4F:
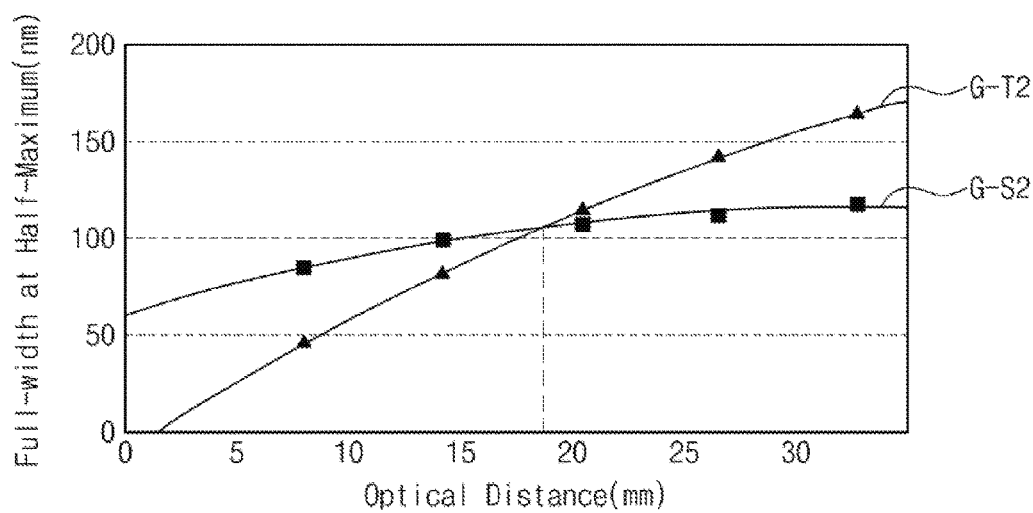
FIG. 4F is a graph showing a full-width at half-maximum (FWHM) as a function of an optical distance of light emitting diode packages according to exemplary embodiments of the present disclosure.

FIG. 4A is a plan view showing light sources disposed on a top surface of a bottom cover, FIG. 4B is a cross-sectional view showing portions of the light sources disposed on the top surface of the bottom cover and an optical member, FIGS. 4C and 4D are cross-sectional views showing light emitting diode packages according to exemplary embodiments of the present disclosure, FIG. 4E is a graph showing a light intensity as a function of a luminous view angle of light emitting diode packages according to exemplary embodiments of the present disclosure, and FIG. 4F is a graph showing a full-width at half-maximum (FWHM) as a function of an optical distance of light emitting diode packages according to exemplary embodiments of the present disclosure. Hereinafter, the backlight unit 300 will be described in detail with reference to FIGS. 4A to 4F.

Referring to FIG. 4A, the bottom portion 400-BP of the bottom cover 400-B is divided into first, second, and third region R1, R2, and R3 in which the first, second, and third light sources LS1, LS2, and LS3 are disposed, respectively. The second and third regions R2 and R3 (hereinafter respectively referred to as first and second outer regions) are disposed to allow the first region R1 (hereinafter, referred to as a center region) to be disposed between the second and third regions R2 and R3 in the first direction. In FIG. 4A, the reflective sheet RF is not shown and the first, second, and third light sources LS1, LS2, and LS3 respectively including five first light source blocks LB1, five second light source blocks LB2, and five third light source blocks LB3 are shown. The first, second, and third light source blocks LB1, LB2, and LB3 respectively include five first light emitting diode packages LEP1, five second light emitting diode packages LEP2, and five third light emitting diode packages LEP3 are shown in FIG. 4A.

Referring to FIG. 4B, the bottom portion 400-BP may have a curvature different from that of the optical member 200. In the present exemplary embodiment, the curvature of the bottom portion 400-BP may be smaller than the curvature of the optical member 200. Accordingly, optical distances between the optical member 200 and the first to third light emitting diodes LEP1 to LEP3 are different from each other. In detail, each of the optical distances corresponds to a shortest distance between a corresponding light emitting diode package of the first to third light emitting diode packages LEP1 to LEP3 and a lower surface 200-BS of the optical member 200.

The optical distances H1-Max and H1-Min (hereinafter, referred to as first optical distances) of the first light emitting diode packages LEP1 are greater than the optical distances H2-Max and H2-Min (hereinafter, referred to as second optical distances) of the second light emitting diode packages LEP2 and the optical distances H3-Max and H3-Min (hereinafter, referred to as third optical distances) of the third light emitting diode packages LEP3.

The first optical distances H1-Max and H1-Min may be varied depending on the first light source blocks LB1. For instance, the first light emitting diode package LEP1 of the first light source block LB1 disposed at a center portion among the first light source blocks LB1 has a maximum optical distance H1-Max of the first optical distances H1-Max and H1-Min. The first light emitting diode packages LEP1 of the first light source block LB1 adjacent to the first and second outer regions R2 and R3 among the first light source blocks LB1 have a minimum optical distance H1-Min of the first optical distances H1-Max and H1-Min.

The second light emitting diode package LEP2 of the second light source block LB2 disposed adjacent to the center region R1 among the second light source blocks LB2 has a maximum optical distance H2-Max of the second optical distances H2-Max and H2-Min. The second light emitting diode packages LEP2 of the second light source blocks LB2 have the second optical distances H2-Max and H2-Min decreasing as a distance from the center region R1 in the first direction DR1. The second light emitting diode packages LEP2 of the second light source blocks LB2 adjacent to the sidewall 400-SW have the minimum optical distance H2-Min in the first outer region R2.

The third light emitting diode package LEP3 of the third light source block LB3 disposed adjacent to the center region R1 among the third light source blocks LB3 has a maximum optical distance H3-Max of the third optical distances H3-Max and H3-Min. The third light emitting diode packages LEP3 of the third light source blocks LB3 have the third optical distances H3-Max and H3-Min decreasing as a distance from the center region R1 in the first direction DR1.

As shown in FIGS. 4C and 4D, the backlight unit 300 includes different types of light emitting diode packages LEP-1S and LEP-2S. FIG. 4C shows a top emitting diode package as a first type of the light emitting diode package LEP-S1 and FIG. 4D shows a side emitting diode package as a second type of the light emitting diode package LEP-S2.

In the present exemplary embodiment, the first light emitting diode package LEP1 may be the first type of light emitting diode package LEP-S1 and the second and third light emitting diode packages LEP2 and LEP3 may be the second type of light emitting diode package LEP-S2.

Referring to FIG. 4C, the first type light emitting diode package LEP-S1 includes a first light emitting element LEE1 and a first lens L-S1. The first light emitting element LEE1 includes a body portion 11 disposed on the circuit board PCB, a light emitting diode 12 disposed on the body portion 11, and a sealing layer 13 covering the light emitting diode 12. Leads (not shown) connecting the light emitting diode 12 and the circuit board PCB are disposed on the body portion 11.

The first lens L-S1 has a semi-spherical convex outer lens surface LOS-S1. In addition, the first lens L-S1 includes a first recess portion 21 defined in a peak region of the outer lens surface LOS-S1. The first lens L-S1 includes a second recess portion 22 defined in a center region of a lower surface thereof. The second recess portion 22 is defined by a semi-spherical concave inner lens surface LIS-S1. The shape of the first lens L-S1 should not be limited to FIG. 4C as long as the first lens L-S1 includes semi-spherical convex outer lens surface LOS-S1.

Referring to FIG. 4D, the second type light emitting diode package LEP-S2 includes a second light emitting element LEE2 and a second lens L-S2. The second light emitting element LEE2 a substantially same structure as the first light emitting element LEE1.

The second lens L-S2 includes two reflective surfaces LOS-S2 to reflect light provided from the second light emitting element LEE2 toward side directions thereof. The two reflective surfaces LOS-S2 are symmetrical to each other with respect to a cross-sectional surface defined by the second and third directions DR2 and DR3. Each of the two reflective surfaces LOS-S2 has a half-arch shape when viewed from a cross-sectional surface defined by the first and third directions DR1 and DR3. One reflective surface of the two reflective surfaces LOS-S2 guides the light generated by the second light emitting element LEE2 to a first side of the first direction DR1 and the other reflective surface of the two reflective surfaces LOS-S2 guides the light generated by the second light emitting element LEE2 to a second side of the first direction DR1, which is opposite to the first side.

In FIG. 4E, a first graph (G-T1) shows the light intensity as a function of the luminous view angle of the first type light emitting diode packages LEP-S1 and a second graph (G-S1) shows the light intensity as a function of the luminous view angle of the second type light emitting diode packages LEP-S2. The luminous view angle represented by an X-axis of FIG. 4E accords to angles shown in FIGS. 4C and 4D. Values represented by a Y-axis of FIG. 4E are relative values.

According to the first and second graphs (G-T1 and G-S1), the second type light emitting diode package LEP-S2 has a maximum light intensity at the luminous view angle greater than that of the first type light emitting diode package LEP-S1. The second light emitting diode package LEP-S2 has the maximum light intensity at the luminous view angle in a range from about −90 degrees to about −60 degrees or in a range from about 60 degrees to about 90 degrees, and the first type light emitting diode package LEP-S1 has the maximum light intensity at the luminous view angle in a range from about −30 degrees to about +30 degrees.

Therefore, the ratio of the light reflected by the second type light emitting diode package LEP-S2 to the side surface is higher than the ratio of the light reflected by the first type light emitting diode package LEP-S1 to the side surface. The light generated by the second type light emitting diode package LEP-S2 travels in a wider area than that in which the light generated by the first type light emitting diode package LEP-S1 travels.

In FIG. 4F, a first graph (G-T2) shows the full-width at half-maximum as a function of the optical distance of the first type light emitting diode package LEP-S1 and a second graph (G-S2) shows the full-width at half-maximum as a function of the optical distance of the second type light emitting diode package LEP-S2. The optical distance at which the full-width at half-maximum of the first type light emitting diode package LEP-S1 is substantially the same as the full-width at half-maximum of the second type light emitting diode package LEP-S2 is defined as a reference distance. In the present exemplary embodiment, the reference distance is about 19 mm. The reference distance is in a range from about 15 mm to about 20 mm according to types and structures of the light emitting diodes included in the first type light emitting diode package LEP-S1 and the second type light emitting diode package LEP-S2.

When the optical distance is greater than the reference distance, the first type light emitting diode package LEP-S1 has the full-width at half-maximum greater than that of the second type light emitting diode package LEP-S2. Referring to FIG. 4B, the first type light emitting diode package LEP-S1 is applied to the first light emitting diode packages LEP1 disposed in the center region R1 in which the optical distance is greater than the reference distance.

When the optical distance is smaller than the reference distance, the second type light emitting diode package LEP-S2 has the full-width at half-maximum greater than that of the first type light emitting diode package LEP-S1. Referring to FIG. 4B, the second and third light emitting diode packages LEP2 and LEP3 disposed in the first and second regions R2 and R3 in which the optical distance is smaller than the reference distance may be the second type light emitting diode package LEP-S2. As described above, the first type light emitting diode package LEP-S1 or the second type light emitting diode package LEP-S2 different from the first type light emitting diode package LEP-S1 are disposed in the center region R1 and the first and second outer regions R2 and R3 in accordance with the optical distance, and thus a light efficiency may increase.

According to a comparison example, the first type light emitting diode package LEP-S1 is disposed regardless of the optical distance. When the first type light emitting diode package LEP-S1 is disposed in the first and second outer regions R2 and R3 each in which the optical distance is smaller than the reference distance, a bright spot occurs on the optical member 200, and thus an optical stain is caused. In the present exemplary embodiment, since the first type light emitting diode package LEP-S1 or the second type light emitting diode package LEP-S2 is disposed in accordance with the optical distance, the bright spot may be prevented from occurring and the light may be uniformly provided to the regions R1, R2, and R3 regardless of the regions R1, R2, and R3.

Meanwhile, the present exemplary embodiment should not be limited to that the same first type light emitting diode package LEP-S1 is disposed in the center region R1. That is, the top emitting diode packages emitting the light in different amounts according to the optical distance may be arranged in the center region R1. In addition, the top emitting diode packages having different luminous view angles of the maximum light intensity may be arranged in the center region R1. Further, the present exemplary embodiment should not be limited to that the same second type light emitting diode package LEP-S2 is disposed in the first and second regions R2 and R3. That is, the top emitting diode packages emitting the light in different amounts according to the optical distance may be arranged in the first and second regions R2 and R3.

Figure 5A:
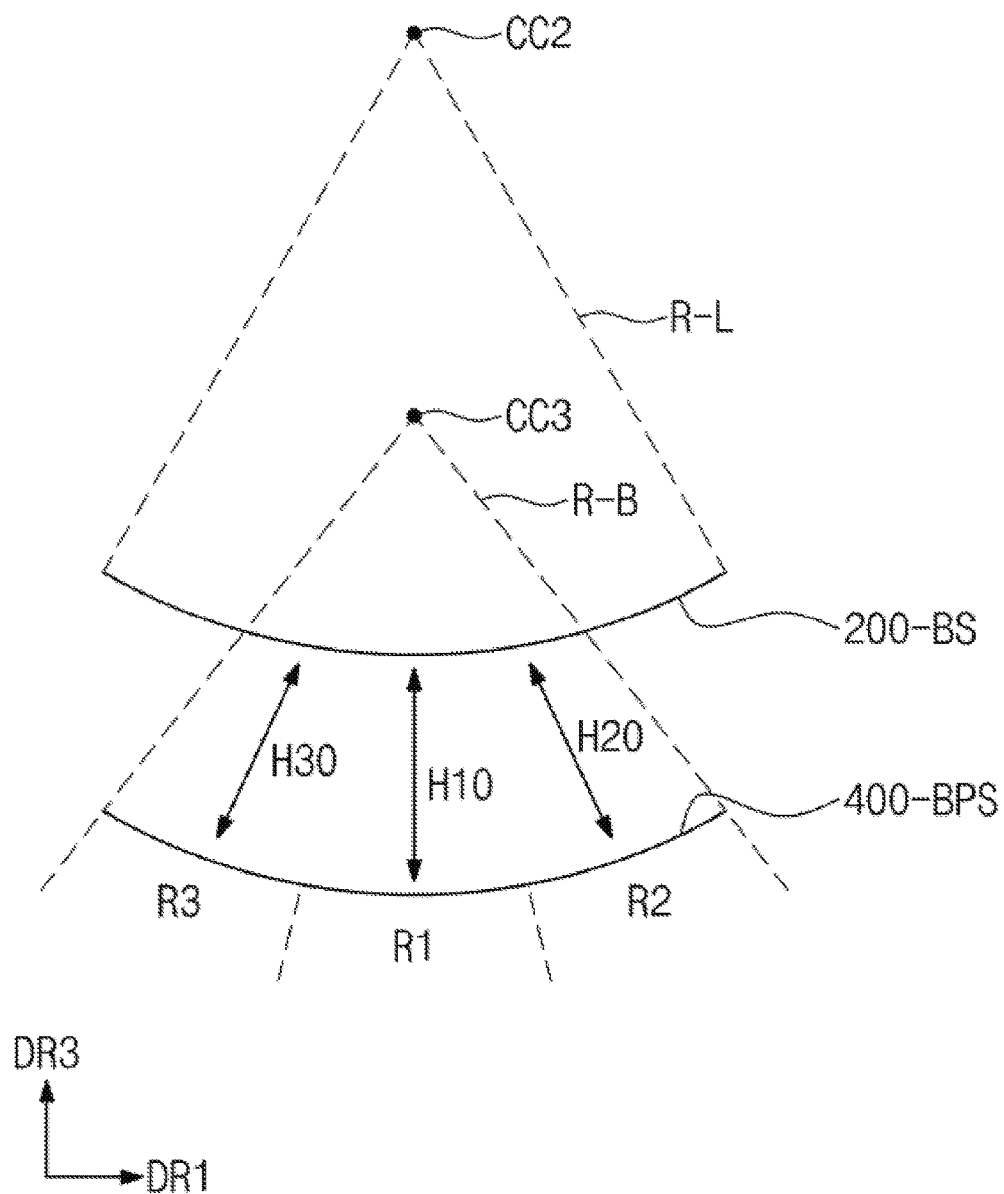
FIGS. 5A to 5C are views showing various distances between an optical member and bottom surfaces of backlight units according to exemplary embodiments of the present disclosure.
Figure 5B:
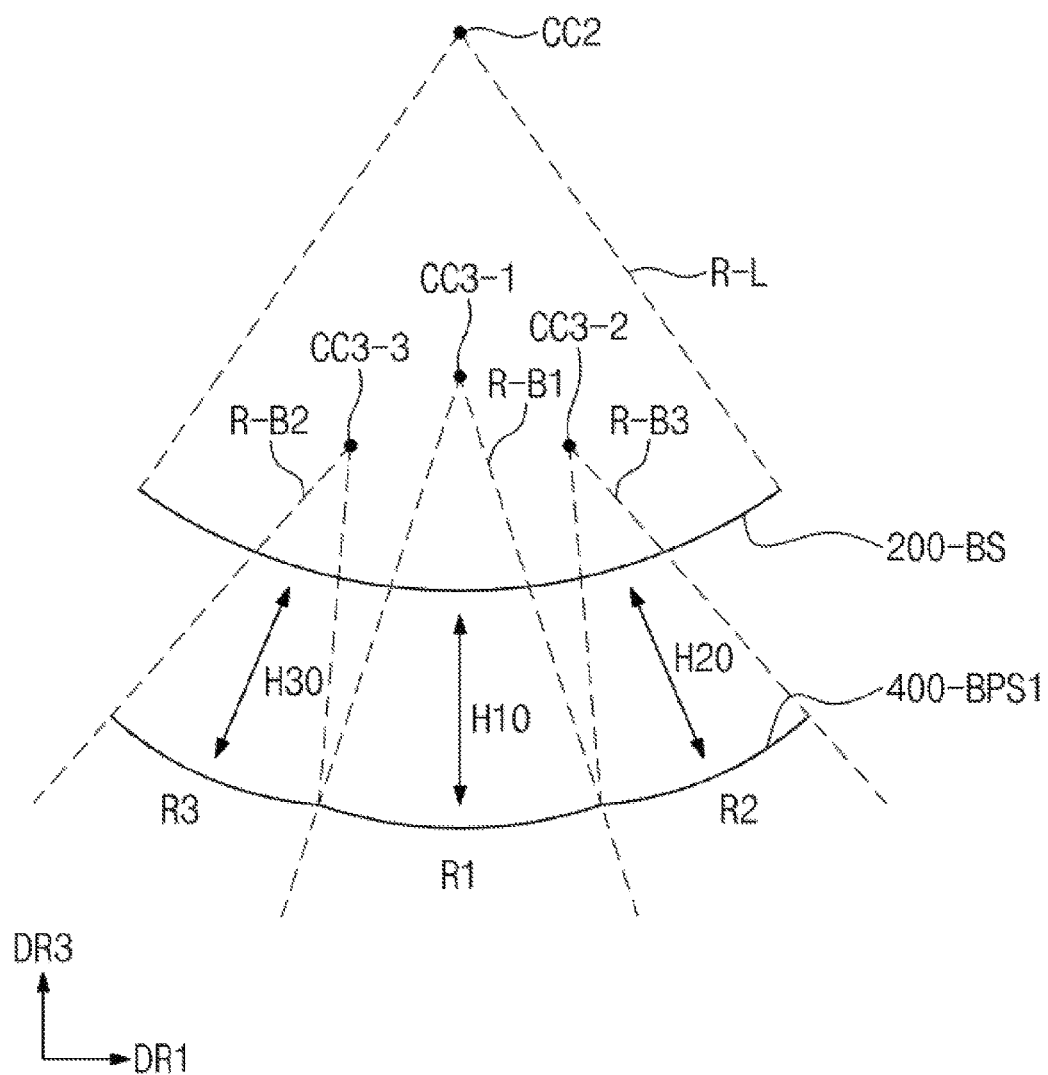
Figure 5C:
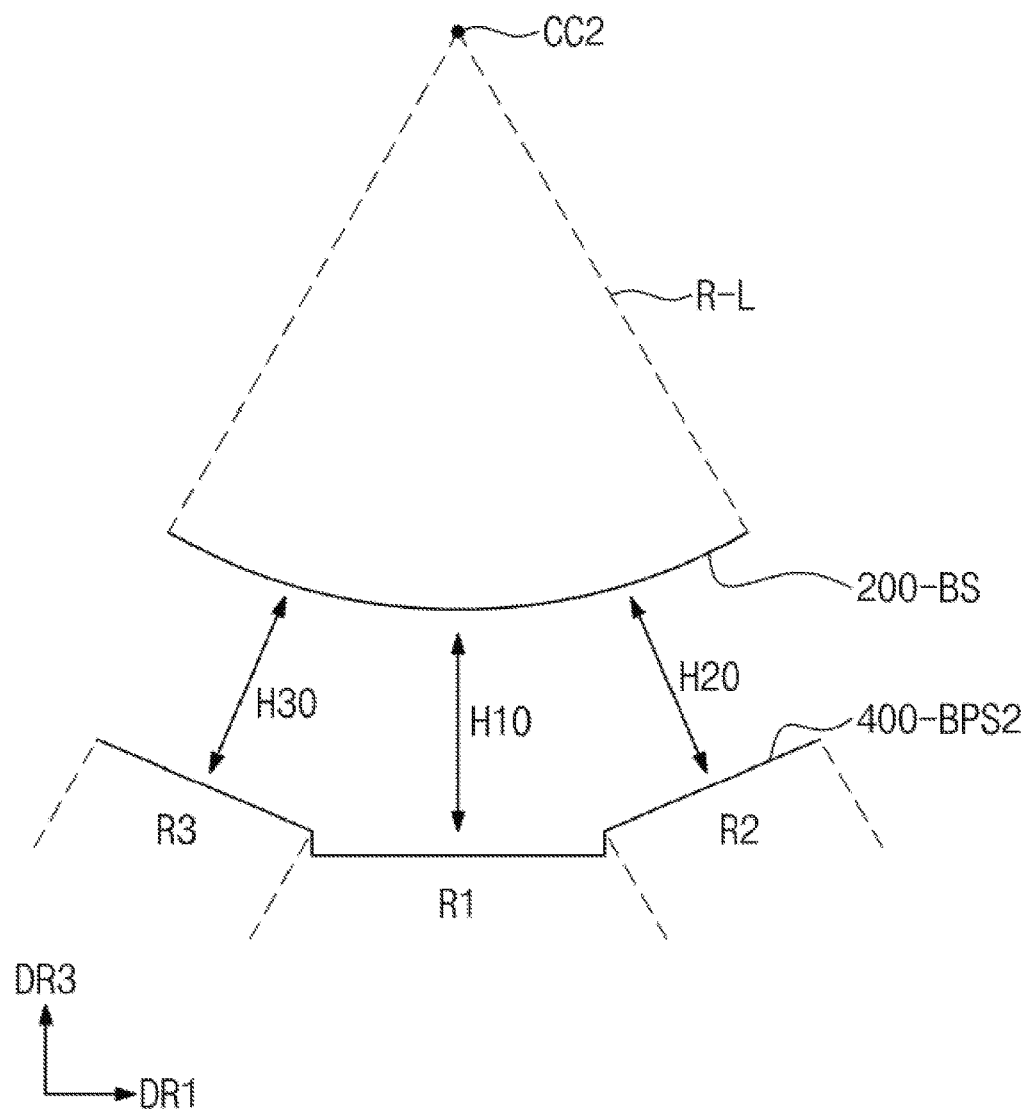

FIGS. 5A to 5C are views showing various distances between an optical member and bottom surfaces of backlight units according to exemplary embodiments of the present disclosure. In FIGS. 5A to 5C, the same reference numerals denote the same elements in FIGS. 1 to 4F, and thus detailed descriptions of the same elements will be omitted.

FIGS. 5A to 5C show distances H10, H20, and H30 between the lower surface 200-BS of the optical member 200 and the bottom portion 400-BP of the bottom cover 400-B. The optical distances H1-Max, H1-Min, H2-Max, H2-Min, H3-Max, and H3-Min described with reference to FIGS. 4A to 4F may be related to the distances (hereinafter, referred to as separation distances) H10, H20, and H30 shown in FIGS. 5A to 5C. Since the light emitting diode packages have the same height in the third direction DR3, the separation distances H10, H20, and H30 shown in FIGS. 5A to 5C are in proportion to the first to third optical distances H1-Max, H1-Min, H2-Max, H2-Min, H3-Max, and H3-Min.

FIGS. 5A to 5C briefly show the top surface 400-BPS and the bottom cover 400-B and the bottom portion 400-BP may be manufactured in various ways to have the top surface 400-BPS.

Referring to FIG. 5A, the lower surface 200-BS of the optical member 200 has a predetermined curvature and a predetermined radius of curvature R-L (hereinafter, referred to as a second radius of curvature) with respect to a second point CC2 as a center. The top surface 400-BPS of the bottom portion 400-BP has a predetermined curvature and a predetermined radius of curvature R-B (hereinafter, referred to as a third radius of curvature) with respect to a third point CC3 as a center.

A first separation distance H10 is greater than second and third separation distances H20 and H30. The first optical distances H1-Max and H1-Min greater than the second optical distances H2-Max and H2-Min and the third optical distances H3-Max and H3-Min may be secured. Although not shown in figures, the top surface 400-BPS of the bottom portion 400-BP may not be curved along the second direction DR2.

Referring to FIG. 5B, the bottom portion 400-BP may have different radius of curvatures R-B1, R-B2, and R-B3 from each other in accordance with the regions R1, R2, and R3. The first and second outer regions R2 and R3 of the bottom portion 400-BP may have a radius of curvature smaller than that of the center region R1. The first outer region R2 of the bottom portion 400-BP may have the radius of curvature R-B2 the same as the radius of curvature R-B3 of the bottom portion 400-BP.

Referring to FIG. 5C, the bottom portion 400-BP may have a stepped shape. The center region R1 is concavely recessed from the first and second outer regions R2 and R3. Accordingly, the first optical distances H1-Max and H1-Min are greater than the second optical distances H2-Max and H2-Min and the third optical distances H3-Max and H3-Min may be secured.

Figure 6A:
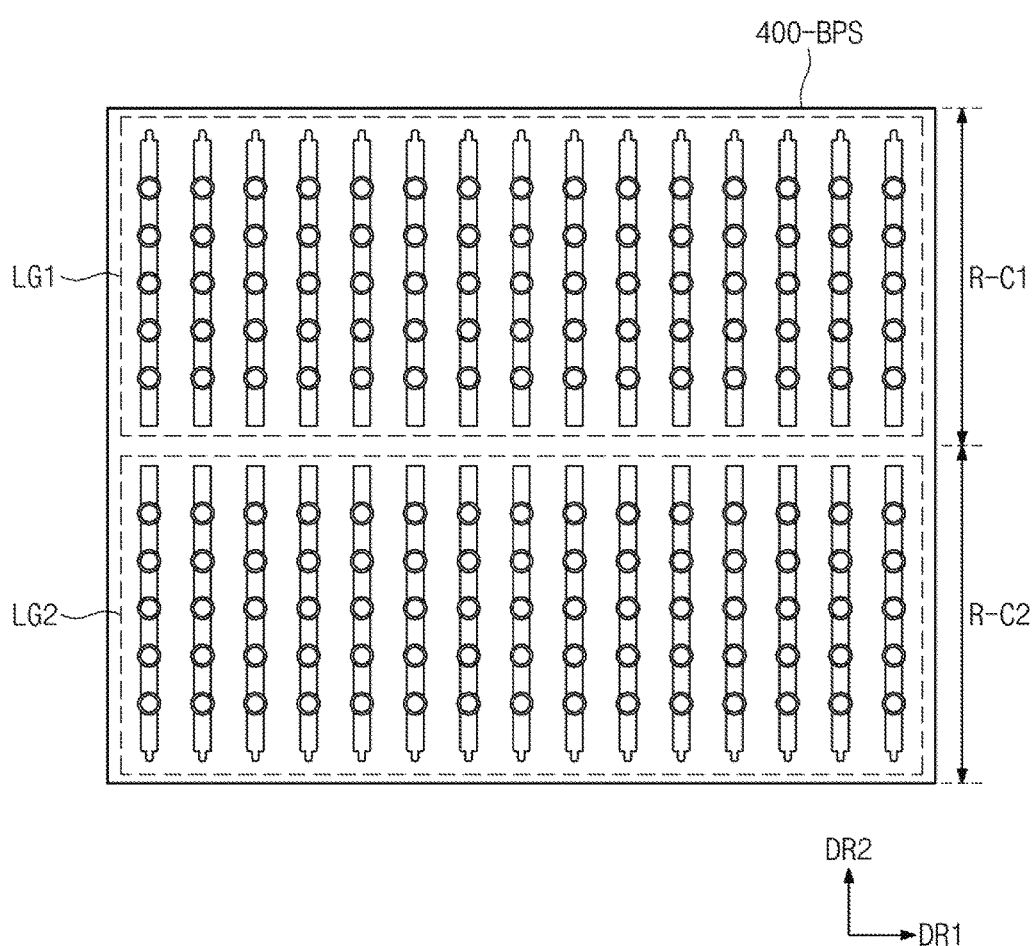
FIGS. 6A to 6C are plan views showing light sources disposed on a top surface of a bottom cover of a backlight unit according to exemplary embodiments of the present disclosure.
Figure 6B:
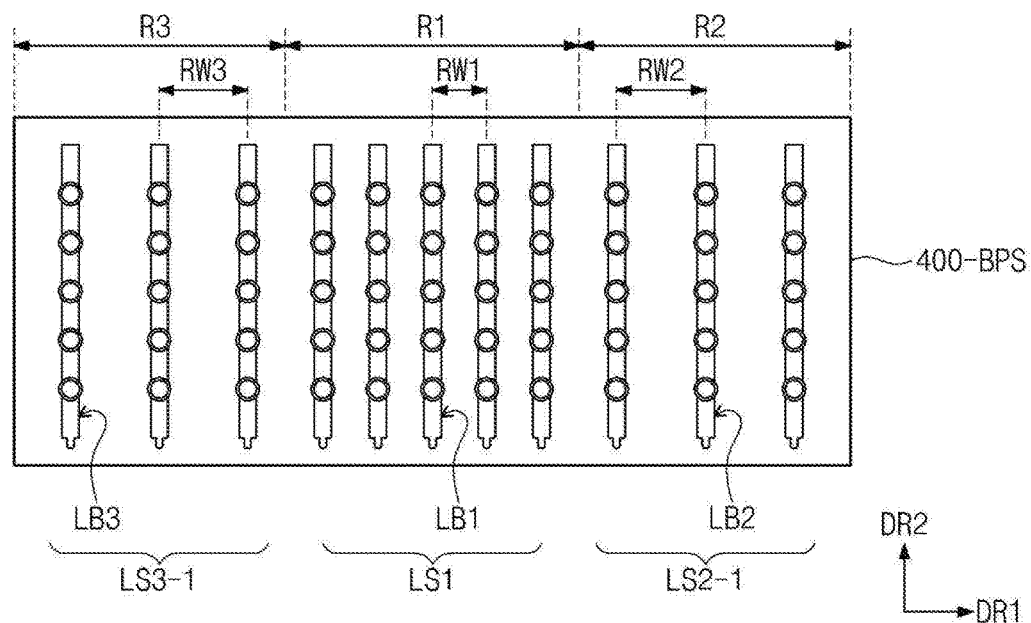
Figure 6C:
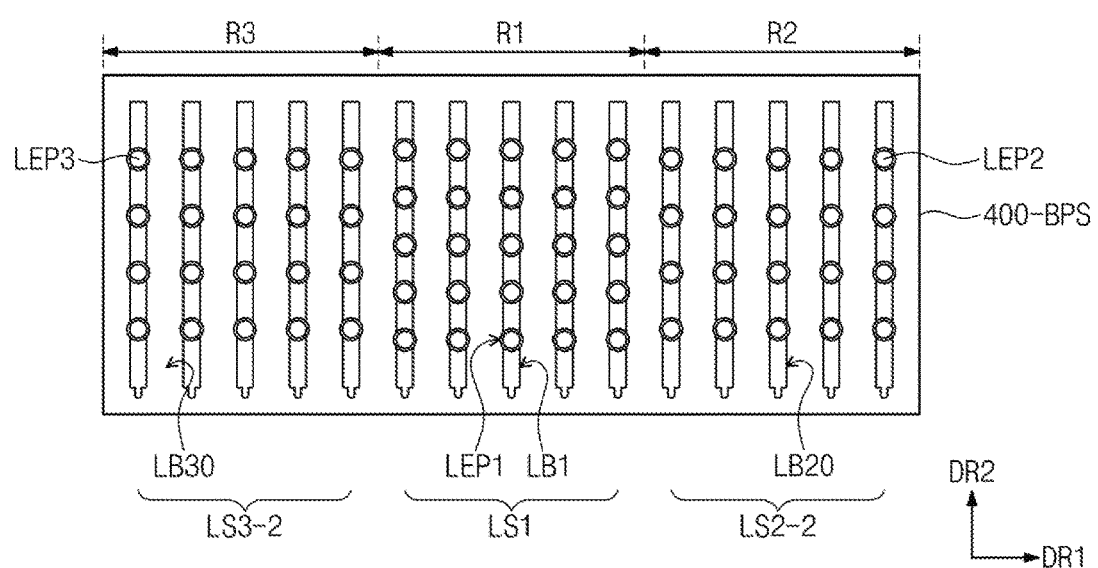

FIGS. 6A to 6C are plan views showing light sources LS1, LS2, and LS3 disposed on a top surface 400-BPS of a bottom cover 400-B of a backlight unit 300 according to exemplary embodiments of the present disclosure. In FIGS. 6A to 6C, the same reference numerals denote the same elements in FIGS. 1 to 5C, and thus detailed descriptions of the same elements will be omitted. Hereinafter, the display device according to the present exemplary embodiment will be described in detail with reference to FIGS. 6A to 6C.

Referring to FIG. 6A, the top surface 400-BPS of the bottom cover 400-B includes an upper region R-C1 and a lower region R-C2, which are arranged in the second direction DR2. The upper region R-C1 and the lower region R-C2 include a first light source group LG1 and a second light source group LG2 respectively disposed therein.

Each of the first and second light source groups LG1 and LG2 includes the first, second, and third light sources LS1, LS2, and LS3 described with reference to FIG. 4A. Therefore, each of the first, second, and third light sources LS1, LS2, and LS3 is provided in a plural number along the second direction DR2. FIG. 6A shows two of each of the first, second, and third light sources LS1, LS2, and LS3, but the number of each of the first, second, and third light sources LS1, LS2, and LS3 should not be limited to two.

Referring to FIG. 6B, a portion of first, second, and third light sources LS1, LS2-1, and LS3-1 includes a different number of the light source blocks LB1, LB2, and LB3 from the number of the light source blocks LB1, LB2, and LB3 of the other portion of the first, second, and third light sources LS1, LS2-1, and LS3-1. In FIG. 6B, the first light source LS1 includes five first light source blocks LB1, the second light source LS2-1 includes three second light source blocks LS2-1, and the third light source LS3-1 includes three third light source blocks LB3.

A distance RW2 in the first direction DR1 between two second light source blocks LB2 adjacent to each other among the second light source blocks LB2 is greater than a distance RW1 in the first direction DR1 between two first light source blocks LB1 adjacent to each other among the first light source blocks LB1. A distance RW3 in the first direction DR1 between two third light source blocks LB3 adjacent to each other among the third light source blocks LB3 is substantially the same as the distance RW2 in the first direction DR1 between two second light source blocks LB2 adjacent to each other among the second light source blocks LB2.

Referring to FIG. 1, a user perceives the image in front of the display surface DS of the curved display device DD. The user perceives the image displayed on the curved display surface DS at the first point CC1. The user focuses on the center region R1 more than the first and second outer regions R2 and R3 due to the shape of the curved display surface DS. Thus, although the number of the light emitting diode packages arranged in the first and second outer regions R2 and R3 is reduced compared to that of light emitting diode packages arranged in the center region R1, the user does not perceive a difference in brightness between the center region R1 and the first and second outer regions R2 and R3 with respect to the image having a predetermined brightness or more. According to the present exemplary embodiment, the light emitting diode packages are arranged to have different densities depending on the regions, and thus a cost in manufacturing of the backlight unit is reduced.

Referring to FIG. 6C, first, second, and third light sources LS1, LS2-2, and LS3-2 include first, second, and third light source blocks LB1, LB20, and LB30, respectively. A portion of the first, second, and third light source blocks LB1, LB20, and LB30 includes a different number of the light emitting diode packages LEP1, LEP2, and LEP3 from the number of the light emitting diode packages LEP1, LEP2, and LEP3 of the other portion of the first, second, and third light source blocks LB1, LB20, and LB30. In FIG. 6C, the first light source block LB1 includes five first light emitting diode packages LEP1, the second light source block LB20 includes four second light emitting diode packages LEP2, and the third light source block LB30 includes four third light emitting diode packages LEP3.

Although the number of the light emitting diode packages arranged in the first and second outer regions R2 and R3 is reduced compared to that of light emitting diode packages arranged in the center region R1, the user does not perceive a difference in brightness between the center region R1 and the first and second outer regions R2 and R3 with respect to the image having a predetermined brightness or more. According to the present exemplary embodiment, the light emitting diode packages are arranged to have different densities depending on the regions, and thus the manufacturing cost of the backlight unit is reduced.

Figure 7A:
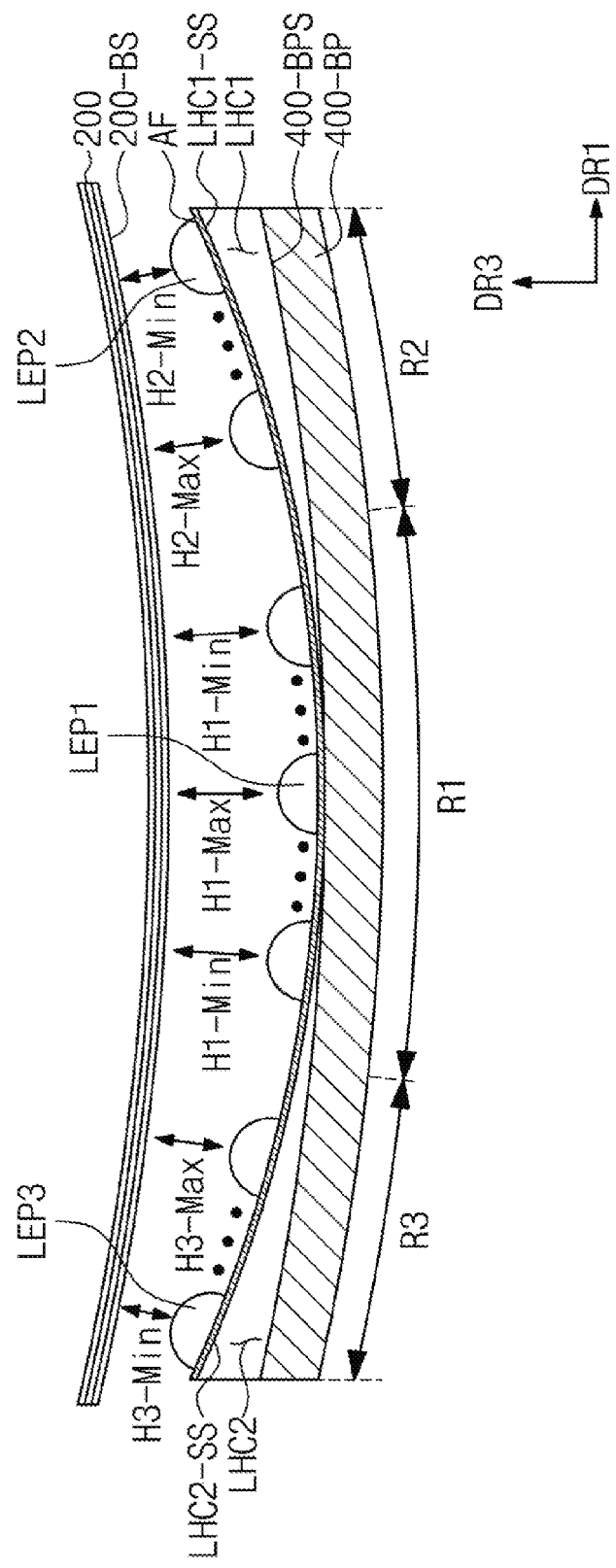
FIG. 7A is a cross-section view showing portions of light sources disposed on a top surface of a bottom cover of a backlight unit and an optical member according to an exemplary embodiment of the present disclosure.
Figure 7B:
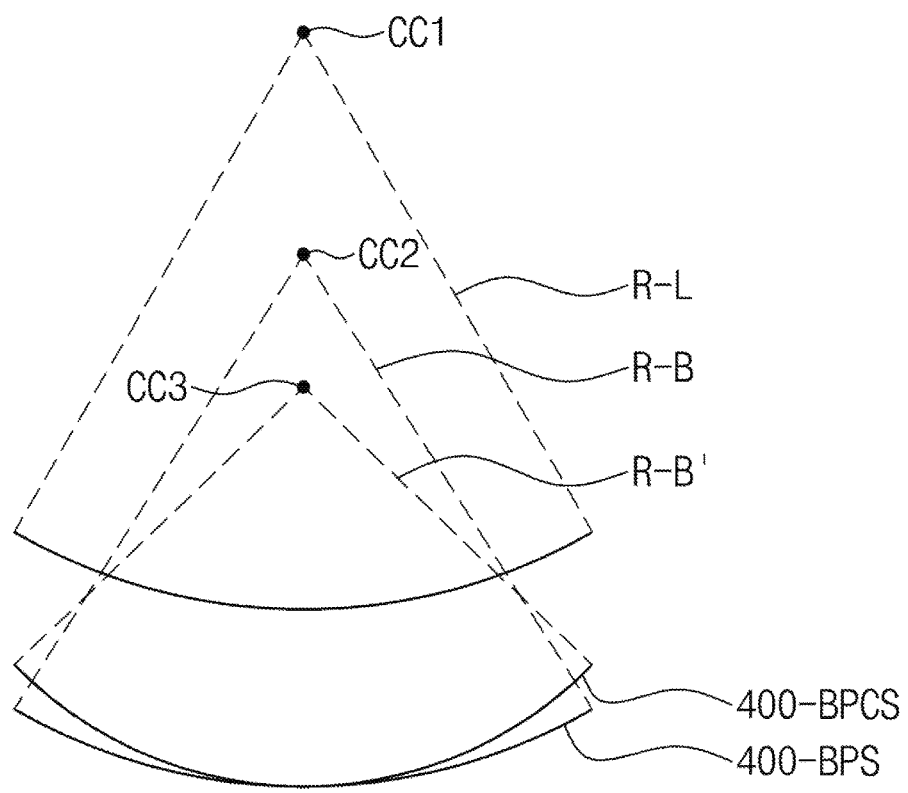
FIG. 7B is a view showing distances between the top surface of the bottom cover and the optical member shown in FIG. 7A.

FIG. 7A is a cross-section view showing portions of light sources LS1, LS2, and LS3 disposed on a top surface 400-BPS of a bottom cover 400-B and an optical member 200 according to an exemplary embodiment of the present disclosure and FIG. 7B is a view showing distances between the top surface 400-BPS of the bottom cover 400-B and the optical member 200 shown in FIG. 7A. In FIGS. 7A and 7B, the same reference numerals denote the same elements in FIGS. 1 to 6C, and thus detailed descriptions of the same elements will be omitted. Hereinafter, the display device according to the present exemplary embodiment of the present disclosure will be described with reference to FIGS. 7A and 7B.

According to the present exemplary embodiment, the display device includes at least one optical distance control member LHC1 and LHC2. FIGS. 7A and 7B show two optical distance control members (hereinafter respectively referred to as first and second optical distance control members) LHC1 and LHC2 respectively disposed in the first and second outer regions R2 and R3 as representative examples.

Different from the above-mentioned embodiments, the bottom portion 400-BP of the bottom cover 400-B may have the same curvature and the same radius of curvatures R-L and R-B' as those of the optical member 200. The separation distance between the lower surface 200-BS and the top surface 400-BPS is constant regardless of the regions R1, R2, and R3.

To control the first optical distances H1-Max and H1-Min, the second optical distances H2-Max and H2-Min, and the third optical distances H3-Max and H3-Min as the method described with reference to FIGS. 4A to 4F, the first and second optical distance control members LHC1 and LHC2 are disposed on the top surface 400-BPS of the bottom portion 400-BP. A thickness in third direction DR3 of the first and second optical distance control members LHC1 and LHC2 increases as a distance from the center region R1 increases in the first direction DR1. The thickness of the first and second optical distance control members LHC1 and LHC2 gradually or stepwisely increases along the first direction DR1.

The first optical distance control member LHC1 provides a first support surface LHC1-SS on which the second light source block LB2 is disposed and the second optical distance control member LHC2 provides a second support surface LHC2-SS on which the third light source block LB3 is disposed. The reflection sheet RF is partially overlapped with the first and second support surfaces LHC1-SS and LHC2-SS.

In the present exemplary embodiment, each of the first and second optical distance control members LHC1 and LHC2 is integrally formed as a single unitary and individual unit, but it should not be limited thereto or thereby. That is, each of the first and second optical distance control members LHC1 and LHC2 may include plural parts disposed to be spaced apart from each other. Each of the parts supports a corresponding light source block of the light source blocks.

The bottom portion 400-BP of the bottom cover 400-B according to the present exemplary embodiment provides a curved and smooth surface. In the present exemplary embodiment, the separation distance between the lower surface 200-BS of the optical member 200 and the top surface 400-BPS of the bottom portion 400-BP in the first and second outer regions R2 and R3 is greater than the separation distance between the lower surface 200-BS of the optical member 200 and the top surface 400-BPS of the bottom portion 400-BP in the center region R1. In this case, the first and second optical distance control members LHC1 and LHC2 may control the first optical distances H1-Max and H1-Min, the second optical distances H2-Max and H2-Min, and the third optical distances H3-Max and H3-Min as the method described with reference to FIGS. 4A to 4F.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display device comprising:
a display panel comprising a display surface defined along a first direction and a second direction substantially perpendicular to the first direction, the display panel being curved along the first direction; and
a backlight unit configured to provide the display panel with light, the backlight unit comprising:
a first light source comprising a top emitting diode package;
second and third light sources each comprising a side emitting diode package, the second and third light sources being arranged in the first direction such that the first light source is disposed between the second and third light sources; and
an optical member disposed between the display panel and the first, second, and third light sources, the optical member being curved along the first direction,
wherein an optical distance between the top emitting diode package of the first light source and the optical member is greater than optical distances between the optical member and the side emitting diode packages of the second and third light sources.

2. The display device of claim 1, wherein:
the optical distance between the top emitting diode package of the first light source and the optical member is greater than a reference distance; and
the optical distances between the optical member and the side emitting diode packages of the second and third light sources is smaller than the reference distance.

3. The display device of claim 2, wherein, at the reference distance, a full-width at half-maximum of the top emitting diode package is substantially same as a full-width at half-maximum of the side emitting diode package.

4. The display device of claim 3, wherein the reference distance is in a range from about 15 mm to about 20 mm.

5. The display device of claim 3, wherein the optical member comprises a diffusion sheet.

6. The display device of claim 1, wherein:
the first light source comprises first light source blocks arranged in the first direction, each of the first light source blocks comprising:
first light emitting diode packages arranged in the second direction, and
a first circuit board configured to apply an electrical signal to the first light emitting diode packages, each of the first light emitting diode packages being the top emitting diode package,
each of the second and third light sources comprises second light source blocks arranged in the first direction, each of the second light source blocks comprising:
second light emitting diode packages arranged in the second direction; and
a second circuit board configured to apply an electrical signal to the second light emitting diode packages, each of the second light emitting diode packages being the side emitting diode package.

7. The display device of claim 6, wherein:
each of the first light emitting diode packages comprises:
- a first light emitting element; and
- a first lens disposed on the first light emitting element, the first lens having a semi-spherical convex lens surface; and each of the second light emitting diode packages comprises:
- a second light emitting element; and
- a second lens disposed on the second light emitting element, the second lens comprising:
  - a first lens surface configured to guide some of light emitted from the second light emitting element to a first side of the second light emitting element; and
  - a second lens surface configured to guide some of the light emitted from the second light emitting element to a second side of the second light emitting element, the second side opposing the first side in the first direction.

8. The display device of claim 6, wherein each of the first, second, and third light sources is provided in a plural number along the second direction.

9. The display device of claim 6, wherein a distance in the first direction between adjacent first light source blocks among the first light source blocks is smaller than a distance in the first direction between adjacent second light source blocks among the second light source blocks.

10. The display device of claim 6, wherein each of the first light source blocks comprise a greater number of light emitting diode packages than each of the second light source blocks.

11. The display device of claim 1, further comprising:
- a bottom cover curved along the first direction, the bottom cover accommodating the display panel and the backlight unit; and
- a top cover curved along the first direction, the top cover covering the display panel.

12. The display device of claim 11, wherein:
the bottom cover comprises:
- a top surface;
- a first outer region;
- a center region; and
- a second outer region;
the first and second outer regions are arranged in the first direction such that the center region is disposed between the first and second outer regions;
the first light source is disposed in the center region; and
the second and third light sources are respectively disposed in the first and second outer regions.

13. The display device of claim 12, wherein the top surface of the bottom cover has a curvature smaller than that of the top cover.

14. The display device of claim 13, wherein:
the top cover has a first curvatures;
the center region has a second curvature smaller than the first curvature; and
each of the first and second outer regions has a third curvature smaller than the second curvature.

15. The display device of claim 1, further comprising:
- a bottom cover accommodating the display panel and the backlight unit; and
- a top cover covering the display panel and curved along the first direction,
wherein the bottom cover comprises a top surface, the top surface comprising:
- a first outer region;
- a center region; and
- a second outer region, the center region being disposed between the first and second outer regions in the first direction, and wherein:
the center region is recessed from the first and second outer regions;
the first light source is disposed in the center region; and
the second and third light sources are respectively disposed in the first and second outer regions.

16. The display device of claim 1, further comprising:
a bottom cover accommodating the display panel and the backlight unit, the bottom cover being curved along the first direction and comprising:
- a first outer region;
- a center region; and
- a second outer region, the center region being disposed between the first and second outer regions in the first direction;
a first optical distance control member disposed in the first outer region;
a second optical distance control member disposed in the second outer region; and
a top cover covering the display panel and curved along the first direction.

17. The display device of claim 16, wherein:
the top surface of the bottom cover and the optical member have substantially equivalent curvatures;
the first optical distance control member provides a first support surface on which the second light source is disposed;
the second optical distance control member provides a second support surface on which the third light source is disposed;
the first optical distance control member has a thickness that increases with increasing distance from the center region in the first direction; and
the second optical distance control member has a thickness that increases with increasing distance from the center region in the first direction.

18. The display device of claim 1, wherein:
the top emitting diode package comprises a first lens; and
the side emitting diode package comprises a second lens having a different shape from the first lens.

19. A display device comprising:
a display panel curved along a determined direction; and
a backlight unit configured to provide the display panel with light, the backlight unit comprising:
- a first light source comprising a first light emitting diode package;
- second and third light sources arranged in the determined direction such that the first light source is disposed between the second and third light sources, each of the second and third light sources comprising a second light emitting diode package having a maximum light intensity at a luminous view angle greater than that of the first light emitting diode package; and
- an optical member disposed between the display panel and the first, second, and third light sources,
wherein an optical distance between the first light emitting diode package of the first light source and the optical member is greater than optical distances between the optical member and the second light emitting diode packages of the second and third light sources.

20. The display device of claim 19, wherein:

the first light emitting diode package has a maximum light intensity at the luminous view angle that is in a range between about −30 degrees and about +30 degrees; and the second light emitting diode package has a maximum light intensity at the luminous view angle that is in a range between about −90 degrees and about −60 degrees or in a range between about ±60 degrees and about ±90 degrees.

21. The display device of claim 19, wherein:

the backlight unit comprises:
- a center region in which the first light source is disposed;
- a first outer region in which the second light source is disposed; and
- a second outer region in which the third light source is disposed;

the first outer region, the center region, and the second outer region are sequentially arranged in the determined direction such that the center region is disposed between the first and second outer regions; and the second light emitting diode package has a full-width at half-maximum at an optical distance greater than a full-width at half-maximum at optical distances of the first and second outer regions.

22. A display device comprising:

a display panel comprising a display surface defined along a first direction and a second direction substantially perpendicular to the first direction, the display panel being curved along the first direction; and a backlight unit configured to provide the display panel with light, the backlight unit comprising:
- a first light source comprising top emitting diode packages;
- second and third light sources each comprising side emitting diode packages, the second and third light sources being arranged in the first direction such that the first light source is disposed between the second and third light sources; and
- an optical member disposed between the display panel and the first, second, and third light sources, the optical member being curved along the first direction, wherein an optical distance between the top emitting diode package of the first light source and the optical member is greater than optical distances between the optical member and the side emitting diode packages of the second and third light sources, and wherein each of the second and third light sources have a density of the side emitting diode packages different from a density of the top emitting diode packages of the first light source.

23. The display device of claim 22, wherein:

the optical distance between the top emitting diode package of the first light source and the optical member is greater than a reference distance; and the optical distances between the optical member and the side emitting diode packages of the second and third light sources are smaller than the reference distance.

24. The display device of claim 22, wherein:

the top emitting diode package comprises a first lens; and the side emitting diode package comprises a second lens having a different shape from the first lens.

* * * * *